(12) United States Patent
Peijster (10) Patent No.: US 9,199,829 B2
(45) Date of Patent: Dec. 1, 2015

(54) ASSEMBLY AND A METHOD FOR LIFTING A MODULE OF A LITHOGRAPHY SYSTEM IN A VERTICAL DIRECTION AND A LITHOGRAPHY SYSTEM COMPRISING SUCH ASSEMBLY

(75) Inventor: Jerry Johannes Martinus Peijster, Maartensdijk (NL)

(73) Assignee: MAPPER LITHOGRAPHY IP B.V., Delft (NL)

(*) Notice: Subject to any disclaimer, the term of this patent is extended or adjusted under 35 U.S.C. 154(b) by 543 days.

(21) Appl. No.: 13/610,392

(22) Filed: Sep. 11, 2012

(65) Prior Publication Data
US 2013/0088702 A1 Apr. 11, 2013

Related U.S. Application Data

(60) Provisional application No. 61/533,321, filed on Sep. 12, 2011.

(30) Foreign Application Priority Data

Sep. 12, 2011 (NL) .................................. 2007401

(51) Int. Cl.
*G03B 27/42* (2006.01)
*B66F 7/00* (2006.01)
*B62B 3/02* (2006.01)
(Continued)

(52) U.S. Cl.
CPC ... *B66F 7/00* (2013.01); *B62B 3/02* (2013.01); *B82Y 10/00* (2013.01); *B82Y 40/00* (2013.01); *G03F 7/708* (2013.01); *G03F 7/70733* (2013.01); *G03F 7/70833* (2013.01); *G03F 7/70975* (2013.01); *H01J 37/023* (2013.01); *H01J 37/3007* (2013.01); *H01J 37/3177* (2013.01)

(58) Field of Classification Search
CPC .... B65G 41/008; B65G 41/002; B65G 21/14; B65G 37/00; B65G 41/005; B65G 15/60; B65G 17/02; B65G 39/20; B65G 41/001; B65G 67/08; B65G 2201/0264; B65G 15/62; B62B 3/02; B62B 3/008; B62B 3/022; B62B 5/067; B62B 3/007; B62B 3/025; B62B 3/027; B62B 13/16; B62B 2202/52; B62B 2205/003; B62B 2301/10; B62B 3/14; B62B 5/0083; H01J 37/20
USPC ........................................................ 355/53, 72
See application file for complete search history.

(56) References Cited

U.S. PATENT DOCUMENTS

| | | | |
|---|---|---|---|
| 3,220,331 A | 11/1965 | Evans et al. | |
| 4,256,213 A * | 3/1981 | Shaw et al. | .................... 198/303 |
| 5,285,909 A * | 2/1994 | Slater | ............................ 211/151 |
| 6,688,819 B1 * | 2/2004 | Bradel | ............................. 410/67 |
| 2004/0259364 A1 | 12/2004 | Tanaka et al. | |

(Continued)

*Primary Examiner* — Mesfin T Asfaw
(74) *Attorney, Agent, or Firm* — Blakely Sokoloff Taylor & Zafman LLP (57) ABSTRACT

An assembly and a method for lifting a module of a lithography system from its support and a lithography system including such device are provided. The assembly includes a body and a track. The track comprises a ramp. The body is provided with two wheels. The first wheel vertically may extend a distance h further from a central horizontal plane of the body than the second wheel. An axis of the first wheel may be positioned in the horizontal direction at a distance D from an axis of the second wheel. The track may include a first and a second ramp. The first ramp is positioned at a distance D from the second ramp in the horizontal direction and a distance h in the vertical direction. Insertion of the body between the module and the support causes the module to be lifted from the support.

29 Claims, 5 Drawing Sheets (51) Int. Cl.
*G03F 7/20* (2006.01)
*H01J 37/02* (2006.01)
*H01J 37/30* (2006.01)
*H01J 37/317* (2006.01)
*B82Y 10/00* (2011.01)
*B82Y 40/00* (2011.01)

(56) References Cited

U.S. PATENT DOCUMENTS

2005/0018161 A1  1/2005  Kubo
2010/0051832 A1* 3/2010  Nishisaka et al. ........ 250/504 R
2010/0193711 A1  8/2010  Watanabe et al.

* cited by examiner

ASSEMBLY AND A METHOD FOR LIFTING A MODULE OF A LITHOGRAPHY SYSTEM IN A VERTICAL DIRECTION AND A LITHOGRAPHY SYSTEM COMPRISING SUCH ASSEMBLY

This is a non-provisional application claiming the benefit of U.S. Provisional Application No. 61/533,321, filed Sep. 12, 2011.

The invention relates to an assembly and a method for lifting a module of a lithography system in a vertical direction and a lithography system comprising such device.

Lithography systems for processing a target such as a wafer with a patterning beam are known in the art. Such systems usually comprise modules for generating and projecting a patterning beam on a target or wafer and modules for moving the target with respect to the patterning beam.

During installation of the lithography system or during its maintenance it may be required to lift a module of the system before moving it away from the rest of the system, for example in order to replace the module.

Since the modules of a lithography system may be heavy, a device such as an electric or pneumatic crane may be used for lifting one or more modules. Such a device may be provided inside the lithography system itself or may be provided external from lithography system, in which case it has to be brought into the proximity of the lithography system.

However, the operation of a crane comes with occupation of space either inside the lithography system or in the fabrication space, neither of which is desirable in lithography operations. Moreover, cranes and the like known lifting tools come with such amount of handling time that downtime of the machine may be unreasonably extended. In addition, crane and the like lifting tools may require subsequent handling and/or removing of connections with the item to be lifted, which is considered undesired in view of the expensive and sometimes vulnerable modules that need to be lifted. Such known tools may also disadvantageously come with a requirement to subsequently lift the module to allow removal of a tool lifting part.

It is an object of the present invention to provide an improved assembly for lifting a module of a lithography system, preferably therein obviating one or more of above said disadvantages.

SUMMARY OF THE INVENTION

The object of the invention is achieved by providing an assembly for lifting a module of a lithography system from its support in a vertical direction, comprising:

a body provided with a first and a second wheel, both wheels extending vertically from a central horizontal plane of the body, wherein the first wheel vertically extends further from said horizontal surface of the body than the second; and, a track provided on the module or on said support and arranged for contacting the first and the second wheel of said body and for guiding the body between the module and the support, wherein the track comprises a ramp, wherein insertion of the body between the module and the support causes the module to be lifted from the support.

When the body is advanced over the track and inserted between the module and the support, the body will be translated both horizontally and vertically, because of the ramp. A (liftable) module of a lithography system that is in contact with the body may thus also be translated vertically.

In an embodiment, the first wheel vertically extends a distance h further from said central horizontal plane of the body than the second wheel and an axis of the first wheel is positioned in the horizontal direction at a distance D from an axis of the second wheel.

In an embodiment, the track comprises a first and a second ramp, the first ramp being direct congruent with the second ramp, wherein a start of the first ramp is positioned at said distance D from a start of the second ramp in the horizontal direction and at said distance h from the start of the second ramp in the vertical direction.

It may be understood that the first and second wheel may be replaced by a first and a second gliding device. Each gliding device may comprise a curved surface or a spike for contacting the track at a respective contact point of said surface or said spike. In that case, the first gliding device may vertically extends a distance h further from said central horizontal plane of the body than the second gliding device and the contact point of the first gliding device may be positioned in the horizontal direction at a distance D from the contact point of the second gliding device.

In an embodiment, the body comprises a horizontal surface, wherein the horizontal surface is arranged opposite to the first and second wheel with respect to the central horizontal plane.

When the body is advanced over the track and inserted between the module and the support, the horizontal surface of the body will be translated both horizontally and vertically, but the horizontal surface will remain horizontal, i.e. the horizontal surface of the body will not be rotated. This effect is caused by the shape and the location of the first and the second ramp and a corresponding location of the first and second wheel with respect to the horizontal surface. The liftable module of a lithography system that is in contact with the body may thus also be translated vertical while it is not rotated.

An advantage of the assembly may be that it occupies less space in comparison with a crane or such, either when in the system, or when stored outside the system, e.g. in so-called fab space. It enables the lifting of heavy modules with a relatively limited force, depending on the slope of the ramps. A user may apply the device by pushing the body over the track, e.g. manually in case of a human user. In this way, modules may be lifted that would otherwise not or difficult be able to be easily and well controlled lifted without the assembly, certainly in case of human users such as maintenance staff. Since the body may be quickly inserted, the assembly may enable a quick replacement of modules. This is even more the case, when the assembly enables that a lifted module is transferred onto a moveable cart.

The height of the ramp defines the height the module can be lifted. In this way, the height that the module is lifted is accurately controlled in a straight-forward manner, which may minimize the risk of damage of vulnerable system parts. According to the invention the height of the first and the second ramp correspond to a distance h, wherein the first wheel vertically extends said distance h further from said horizontal surface of the body than the second wheel and wherein a start of the first ramp is positioned at said distance h from the start of the second ramp in the vertical direction.

The distance D may be defined parallel to an insertion direction of the body, i.e. the direction in which the body is inserted between the module and the support.

It may be understood that all the distances that are referred to as "distance D" are equal, while all the distance that are referred to as "distance h" are also equal.

The track may be provided on the support of the liftable module. In that case, the body may be inserted between the liftable module and the track that is provided on the support.

The horizontal surface will then contact the liftable module, while the first and the second wheel contact the track. This configuration is referred to as the normal configuration.

However, the track may also be provided on the liftable module or more particular on a downside of the liftable module. In that case, the body may be inserted between the track and the support. The first and the second wheel will then contact the track provided on the liftable module, while the horizontal surface will then contact the support. This configuration is referred to as the upside-down configuration.

In an embodiment of the assembly according to the invention, the axis of the first wheels and the axis of the second wheel are parallel with respect to each other and/or with respect to the horizontal surface. The axis of the first wheels and the axis of the second wheel may each be arranged perpendicular to an insertion direction of the body.

In an embodiment of the assembly according to the invention, the body is further provided with guiding wheels, wherein said guiding wheels preferably define said horizontal surface.

The first wheel and the second wheel may extend vertically from one side of the body. The guiding wheels may be provided at an opposite side of the body. The axes of the guiding wheels may be arranged parallel with the axes of the first wheels and the second wheel.

The guiding wheels may guide the body when it is inserted between the module and the support. The guiding wheels may be arranged for contacting the liftable module in the normal configuration. In this way, none or less horizontal forces may be applied on the liftable module. A horizontal movement may thus be prevented. In the upside-down configuration the guiding wheels may be arranged for contacting the support.

In an embodiment of the assembly according to the invention, the track further comprises a first and a second horizontal plateau; a start of the first plateau is positioned at the distance D from a start of the second plateau in the horizontal direction and at the distance h from the start of the second plateau in the vertical direction; and, the first plateau is arranged between the first and second ramp.

An advantage of providing a first and a second horizontal plateau is that they enable placing the body in a resting position on these plateaus after lifting the liftable module.

In an embodiment of the assembly according to the invention, the track further comprises a third horizontal plateau, connected to the start of the first ramp. The third horizontal plateau may guide or contact the body when it is inserted between the liftable module and the support before lifting takes place.

In an embodiment of the assembly according to the invention, the first ramp is connected to the second ramp and the first and the second ramp form together a single ramp. The start of the second ramp may be connected to the end of the first ramp. This would yield a single ramp that comprises the first and the second ramp.

In an embodiment of the assembly according to the invention, wherein the first wheel and the second wheel are extending in a vertically downwards direction from the central horizontal plane of the body.

In this embodiment, the first wheel and the second wheel may extend from a down side of the body and the body may be arranged for the normal configuration, as described above.

In another embodiment, wherein the first and the second wheels are extending in a vertically upwards direction from the central horizontal plane of the body. The first wheel and the second wheel may extend from an up side of the body and the body may be arranged for the upside-down configuration, as described above.

In an embodiment of the assembly according to the invention, the assembly further comprises a movable cart for carrying the module, wherein the cart comprises:
guiding wheels for guiding and supporting the module; and,
adjusters for adjusting the position and/or the orientation of the guiding wheels in order to align the guiding wheels of the cart with the guiding wheels of the body.

An advantage of providing such a moveable cart is that is enables moving the liftable module away from the support. When the guiding wheels of the cart are aligned with the guiding wheels of the body and the liftable module is lifted, the lifted body may be horizontally moved along the guiding wheels of body and the guiding wheels of the cart onto the cart. Then the movable cart, that is supporting the module, may be moved away. The axes of guiding wheels of the cart may be arranged parallel with the guiding wheels of the body.

In an embodiment of the assembly according to the invention, the slope of the first ramp and the second ramp is in the range of 1:50-1:200, or about 1:100. An advantage of the providing the first ramp and the second ramp with such a slope is that is enables lifting of a heavy module with relatively little force exerted.

In an embodiment of the assembly according to the invention, the assembly further comprises connectors for releasably connecting the body with the support. An advantage of the connectors may be that they prevent the body from moving after the module has been lifted. This may prevent the body from going back, down the track, after insertion.

The object of the invention is also achieved by providing a lithography system for processing a target with a patterning beam, the lithography system comprising:
a set of modules for providing the patterning beam and for moving the target with respect to the patterning beam, wherein said set comprises a liftable module;
a frame for supporting the set of modules; and,
the assembly according to any of claims 1-9 for lifting said liftable module in the vertical direction, wherein the liftable module is supported by a support, the support being the frame or another module of said set; wherein the track of the assembly is arranged on the support or on the liftable module and the body of the assembly is arranged to be inserted between the liftable module and the support.

In an embodiment of the lithography system according to the invention, a groove is provided in the support or in the liftable module and is arranged for guiding the body during insertion of the body between the liftable module and the support, and the track is provided in the groove.

The body having a first wheel and a second wheel may not be balanced, i.e. it may fall to one side when it is placed on a horizontal area. An advantage of providing a groove may be that the groove prevents the body from falling or that the groove maintains the upright orientation of the body. Furthermore, the groove may guide the body when it is inserted, such that it follows the track.

In an embodiment of the lithography system according to the invention, the lithography system further comprises a restrictor arranged for restricting a movement of the module in an insertion direction of the body.

Because of possible friction between the body and the liftable module, horizontal forces may be applied on the module when the body is inserted. These forces may cause the body to move in a horizontal direction along the direction the body is inserted. A restrictor may prevent such a movement.

The object of the invention is also achieved by providing a method for lifting a module of a lithography system from its support in a vertical direction, comprising the steps of:

providing a lithography system according to any of claims 10-13; and, inserting the body between the liftable module and the support.

In an embodiment of the method according to the invention, the method further comprises the step of:

horizontally moving the liftable with respect to its support, preferably on a movable cart.

According to another aspect of the invention a method is provided for exchanging a module of lithography system, comprising the steps of:

a) providing a lithography system according to any of claims 18-21, b) providing a movable cart for carrying the liftable module;

c) inserting the body between the liftable module and the support, thereby lifting said module from the support;

d) horizontally moving the liftable module with respect to its support onto the movable cart.

In an embodiment, step d) further comprises:

d1) adjusting the position and/or the orientation of guiding wheels of the movable cart in order to align the guiding wheels of said cart with guiding wheels of the body; and, d2) horizontally moving the liftable module with respect to its support onto the guiding wheels of the movable cart.

In an embodiment, the method further comprises the steps of:

e) providing another movable cart for carrying another liftable module, wherein another liftable module is arranged on the other movable cart;

f) horizontally moving the other liftable module with respect to the cart onto the body; and, g) removing the body between the other liftable module and the support, thereby lowering said module onto the support.

In an embodiment, step f) further comprises:

f1) adjusting the position and/or the orientation of guiding wheels of the other movable cart in order to align the guiding wheels of said cart with guiding wheels of the body; and, f2) horizontally moving the liftable module with respect to the cart onto the guiding wheels of the body.

In an embodiment, the movable cart and the other movable cart are the same cart. The effects and advantages of the embodiments of the method according to the invention may be in accordance with the effects and advantages of the embodiments of the assembly and the lithography system as explained above.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
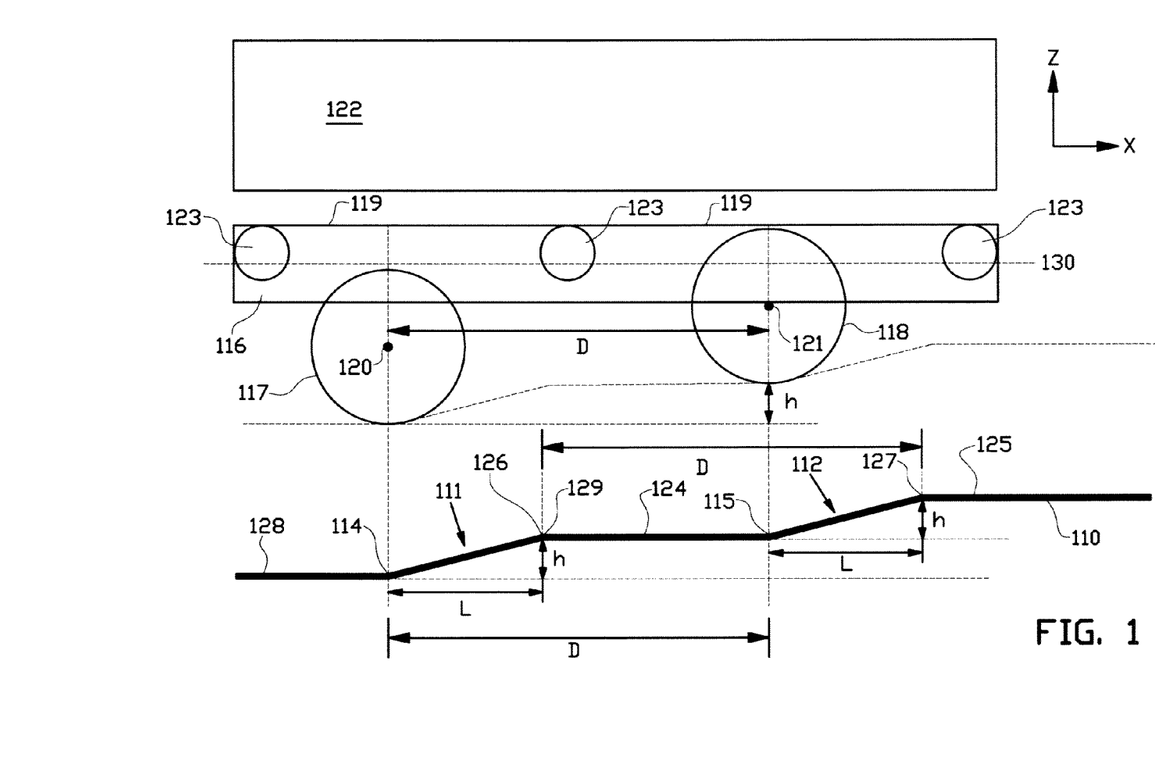
FIG. 1 schematically shows an assembly according to an embodiment of the invention.

In FIG. 1 an assembly according to an embodiment of the invention is schematically shown. A track 110 is provided with a first ramp 111 and a second ramp 112. The first ramp 111 is direct congruent with the second ramp 112, which indicates that their orientation, height (distance h) and length l and slope h/l are the same. A start 114 of the first ramp is positioned at a distance h from a start 115 of the second ramp in a vertical direction (or z-direction) and at a distance D in a horizontal direction (or x-direction).

A body 116 is provided with a first wheel 117 and a second wheel 118. The body 116 comprises a central horizontal plane 130. The body may comprise a horizontal surface 119, which is arranged parallel with the central horizontal plane 130 of the body and opposite to the first wheel 117 and second wheel 118 with respect to the central horizontal plane 130. The first wheel 117 extends a distance h further in the vertical direction from the central horizontal plane 130 than the second wheel 118. An axis 120 of the first wheel is positioned at a distance D from an axis 121 of the second wheel in the horizontal direction.

Instead of the first wheel and the second wheel, the body may also be provided with rollers or any other gliding device, which would enable the body to follow the track 110, while the rollers or other gliding devices remain in contact with the track 110 and the horizontal surface is translating vertically without any rotational movement.

In the case of a first and a second gliding device (instead of a first and second wheel), each gliding device may comprise a curved surface or a spike. Each curved surface or spike is arranged for contacting the track 110 at a respective contact point. In accordance with the embodiments with wheels, the first gliding device may vertically extends a distance h further from said central horizontal plane of the body than the second gliding device and the contact point of the first gliding device may be positioned in the horizontal direction at a distance D from the contact point of the second gliding device.

All features applicable to the embodiments with said first and second wheel may also be applicable to embodiments with said first and second gliding device.

In a lithography system, that is usually operated in vacuum, generation of particles in said vacuum is undesirable. Therefore, an advantage of using wheels instead of gliding devices is a lower generation of particles. Indeed, in the case of gliding devices, wear of the material of the gliding device and/or material of the track can generate particles in the vacuum.

In FIG. 1, the body 116 has been depicted above the track 110 for clarity reasons, but in use the first wheel and the second wheel are in contact with the track 110. When the body is advanced over the track, the body will translate both in the vertical direction as in the horizontal direction without any rotation. This implies that a liftable module 122 that is contact with the body may also be translated in a vertical direction, i.e. it may be lifted. The liftable module may be lifted by a distance h.

A liftable module may be described as a module that is arranged for being lifted by the body 116, when the body is inserted between said module and its support. It may be understood that the liftable module may also be arranged for being lowered by the body 116, when the body is removed between said module and its support.

FIG. 1 schematically shows an embodiment in the so-called normal configuration. However, it may be understood that FIG. 1 may also be turned upside down and that FIG. 1 then schematically shows an embodiment in the so-called upside-down configuration. Reference number 122 may then refer to the support and the track 110 may then be provided on the down side of a liftable module.

The body may be provided with guiding wheels 123, wherein said guiding wheels may define the horizontal surface 119. In use, the guiding wheels may contact the liftable module 122 (in the normal configuration) or the support (in the upside-down configuration). The contact surfaces of the guiding wheels (the surface of a guiding wheel that is, in use, in contact with the liftable module or the support may be referred to as a contact surface of a guiding wheel) may together define the horizontal surface 119.

Instead of guiding wheels 123, the body may also be provided with guiding rollers or any other guiding devices, which would decrease friction between the body 116 and the liftable module 122 (in the normal configuration) or between the body 116 and the support (in the upside-down configuration).

The axes of the first and the second wheel may be arranged parallel with respect to each other, the central horizontal plane 130 and/or with respect to the horizontal surface 119. Said axes may be arranged perpendicular to the insertion direction of the body. The same may apply to the axes of the guiding wheels 123.

The track may further comprise a first horizontal plateau 124 and a second horizontal plateau 125. As can be seen in FIG. 1, a start 126 of the first plateau 124 is positioned at the distance D from a start 127 of the second plateau 125 in the horizontal direction and at the distance h from the start 127 of the second plateau 125 in the vertical direction and the first plateau 124 is arranged between the first ramp 111 and the second ramp 112.

The track may further comprise a third horizontal plateau 128, which is connected to the start 114 of the first ramp.

In an embodiment of the assembly according to the invention, the start 115 of the second ramp 112 may be connected to the end 129 of the first ramp 111. The first horizontal plateau 124 may then be omitted. In that case, the first ramp and the second ramp form together a single ramp, while the first ramp and the second ramp each have a length D. This single ramp will have a height 2 h and a length 2 D with a slope 2h/2D=h/D.

The slope (h/l) of the first ramp and the second ramp may be in the range of 1:50-1:200, or about 1:100. The distance h may be in the range of 0.1-1.0 mm or about 0.5 mm.

Figure 2:
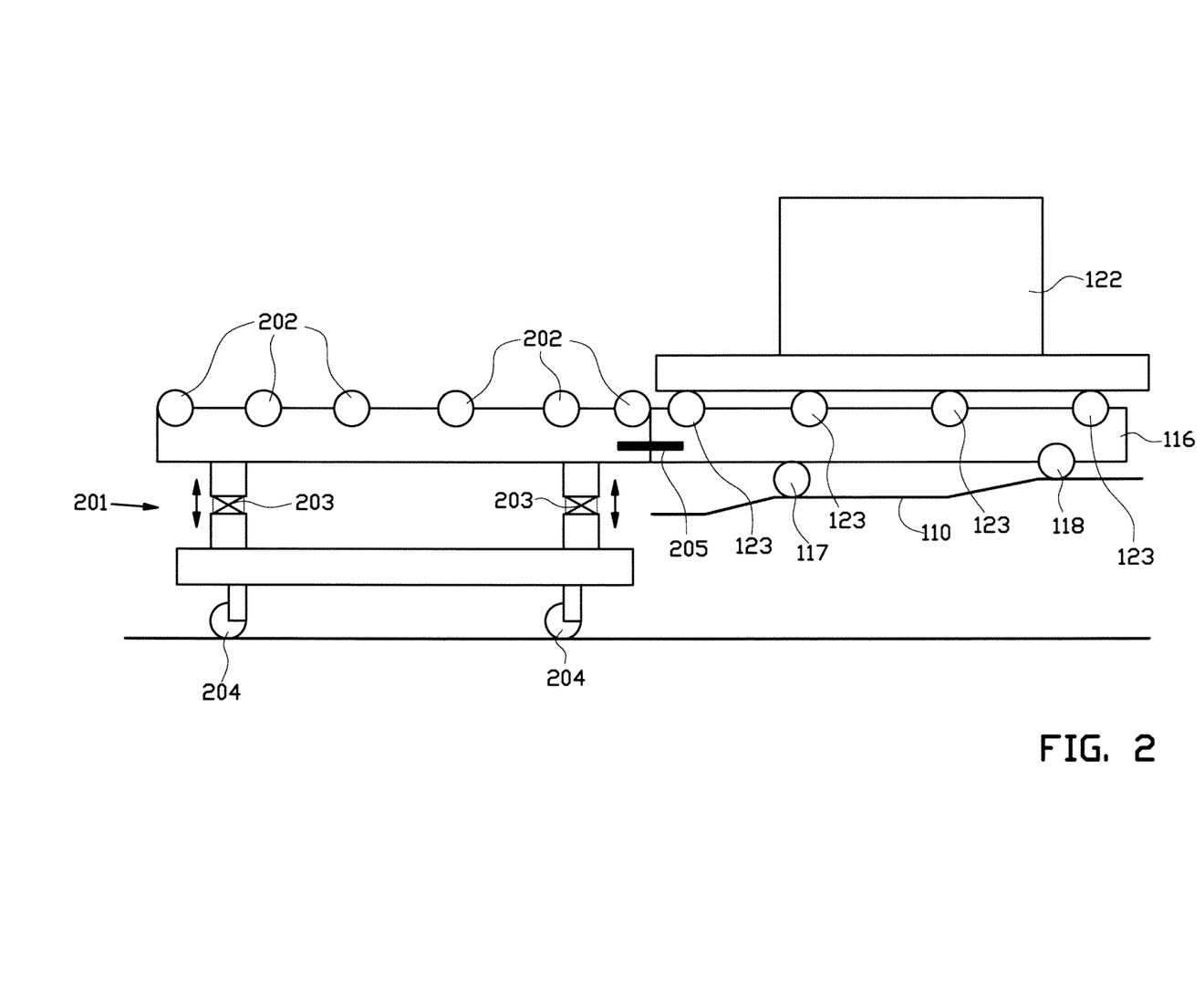
FIG. 2 schematically shows an assembly according to another embodiment of the invention.

In FIG. 2 an assembly according to another embodiment of the invention is schematically shown. In this embodiment a movable cart 201 is provided. The cart 201 may comprise guiding wheels 202 for guiding and supporting the module 122. The movable cart may further comprise adjusters 203 for adjusting the position and/or the orientation of the guiding wheels. The cart 201 may be provided with wheels 204, enabling the cart to be moved towards and from the support of the liftable module.

When the cart 201 is positioned near the liftable module, the position and/or the orientation of the guiding wheels 202 may be adjusted in order to align them with the guiding wheels 123 of the body. The cart 201 and the body 116 may be provided with a docking interface 205 in order to connect the cart 201 with the body 116. After the liftable module 122 is lifted, it may be moved along the guiding wheels of both the body 116 and the cart 201 onto the cart 201. The module 122 may then be moved away, while being carried by the movable cart 201.

Figure 3:
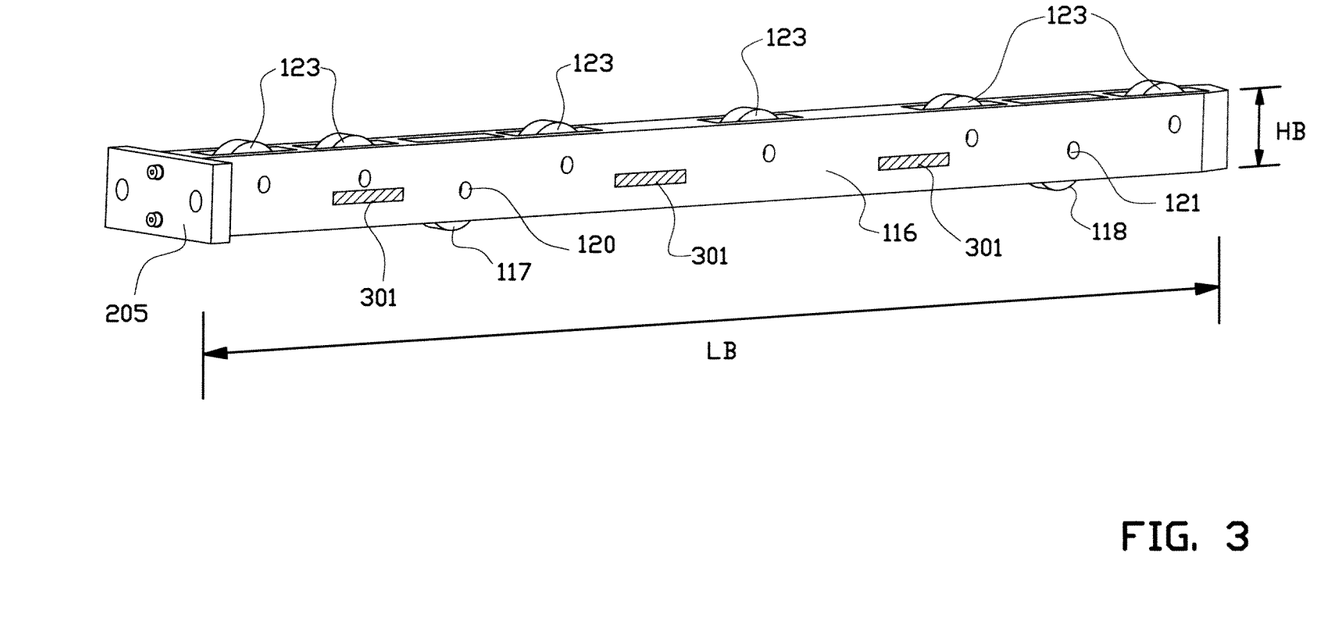
FIG. 3 schematically shows a body of an assembly according to another embodiment of the invention.

FIG. 3 schematically shows a body of an assembly according to another embodiment of the invention. The body may be provided with the first wheel 117, the second wheel 118, the guiding wheels 123 and/or the docking interface 205. The body may have an elongated shape. The length of the body LB may be around 900 mm and the height of the body HB may be around 50 mm. The body 116 may be provided with sliding means 301 for reducing friction between the body and the support.

In an embodiment of the assembly according to the invention, the assembly further comprises another (or a second) body and another (or a second track). What has been described with respect to the (first) body and the (first) track may also apply to the other (or second) body and the other (or second) track respectively. The liftable module may thus lifted by two body-track combinations that are preferably spaced apart from each other.

Figure 4:
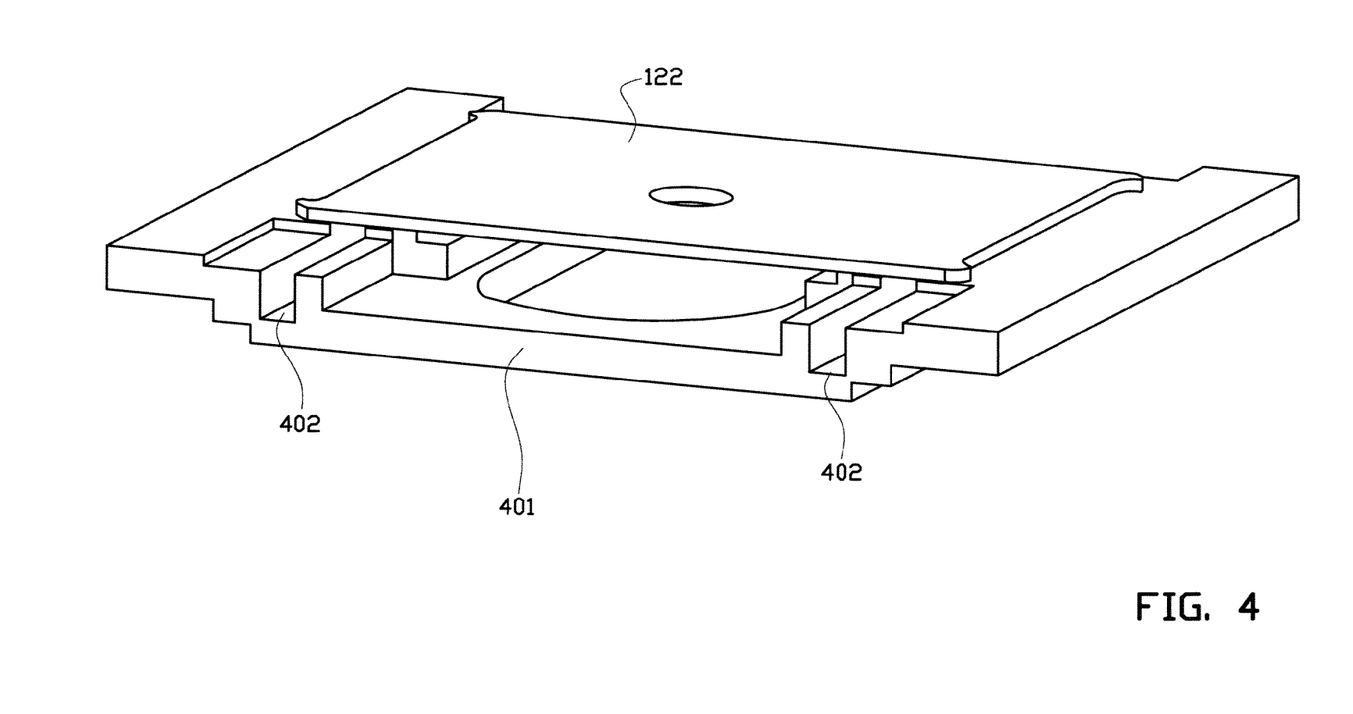
FIG. 4 schematically shows a part of a lithography system according to an embodiment of the invention; and, FIG. 5 schematically shows an overview of a part of a lithography system according to an embodiment of the invention.

FIG. 4 schematically shows a part of a lithography system according to an embodiment of the invention. The lithography system may comprise a set of modules for providing the patterning beam and for moving the target with respect to the patterning beam. At least one of these modules may be a liftable module. The lithography system may further comprise a frame for supporting the set of modules.

In FIG. 4, a liftable module 122 is supported by its support 401. Support 401 may be (a part of a) the frame or another module. In the support 401 a groove 402 may be provided. The shape of the groove 402 may correspond to the shape of the body 116. The groove 402 and the body 116 may each have an elongated shape.

The track 110 may be provided inside the groove 402 (not shown in FIG. 4) on the support. However, the groove 402 may also be provided in the liftable module 122, while the track 110 is provided on the support.

In the embodiment of FIG. 4, two grooves 402 are provided, indicating that the assembly may comprise two bodies 116 and two tracks 110. The two bodies 116 may be connected to each other, for example by a rod. This would enable the simultaneous insertion of the bodies 116.

It may be advantageous to connect the body to the support after the liftable module 122 is lifted. Therefore, connectors may be provided, which may comprise bolts or clamps.

Figure 5:
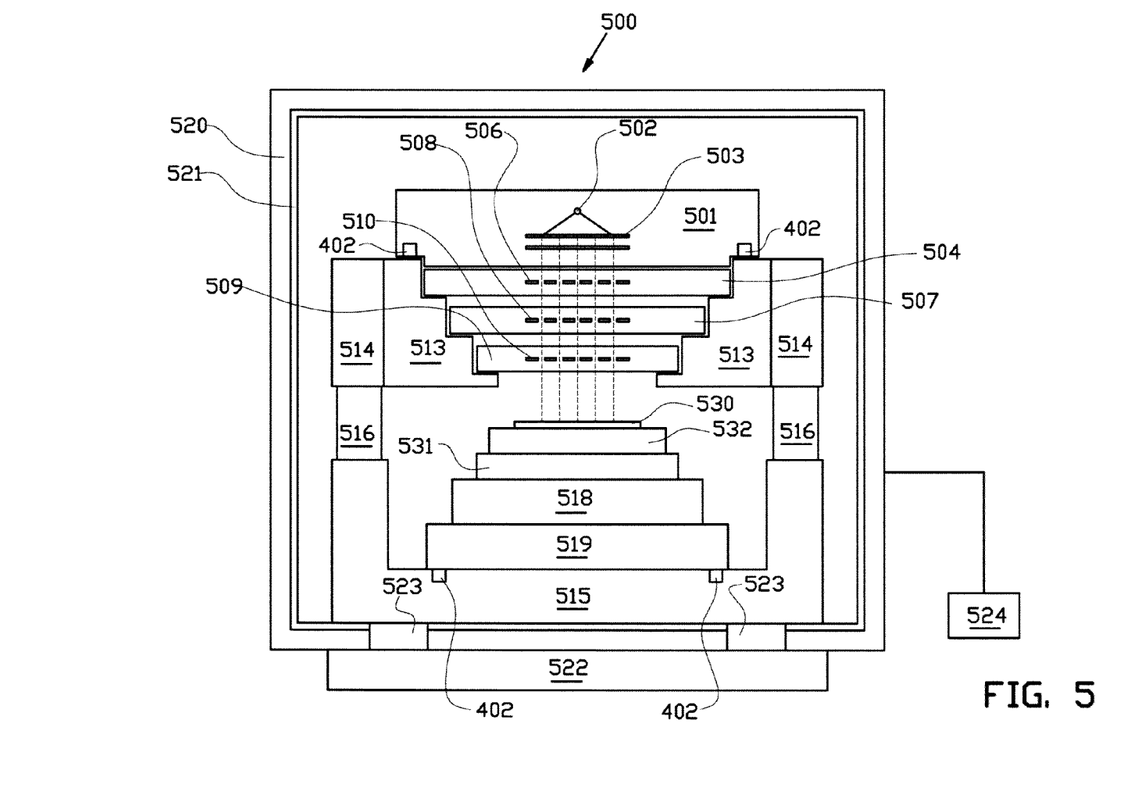

FIG. 5 schematically shows an overview of a part of a lithography system according to an embodiment of the invention. The lithography system 500 is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem may be removed and replaced quickly, without unnecessarily disconnecting or disturbing other systems.

In the embodiment shown in FIG. 5, these modular subsystems (or modules) may include:

an illumination optics module 501, which may comprise a beam source 502 and a beam collimating system 503, an aperture array and condenser lens module 504, which may include an aperture array and condenser lens array, together indicated by 506, a beam switching module 507, which may include beamlet blanker array 508;

a projection optics module 509, which may include a beam stop array, beam deflector array and projection lens array, together indicated by 510;

long stroke module 519 arranged for moving the target 530 along relatively large distances with relatively large positioning errors;

a short stroke module 518 arranged for moving the target or wafer 530 along relatively small distances with relatively small positioning errors; and, a chuck module 531 arranged for supporting a wafer table 532.

The modules may be designed to slide in and out from a frame. Also combinations of modular subsystem may be designed to form one module together, which may slide in and out from a frame together.

The frame may comprise an alignment inner subframe 513, an alignment outer subframe 514 and a main frame 515. The main frame 515 may support the alignment subframes 513 and 514 via vibration damping mounts 516. The system may rests on base plate 522 and may be supported by frame members 523. A wafer table 532 may support wafer 530, while the wafer table is mounted on chuck 531. Chuck 531 may be positioned on a stage short stroke 518 and long stroke 519.

The beam source 502 may provide a patterning beam, comprising a light beam or a charged particle beam such as an electron beam.

The patterning beam from the beam source 502 may be collimated by collimator lens system 503. The collimated beam may impinge on an aperture array, which may block a part of the collimated beam, in order to create a plurality of beamlets, for example at least two beamlets. However, a lithography system according to an embodiment of the invention may be arranged for generating a large number of beamlets, preferably about 10,000 to 1,000,000 beamlets.

The beamlets may pass through a condenser lens array 506, which may focus the beamlets in the plane of a beam blanker array, comprising a plurality of blankers for deflecting one or more of the beamlets.

The deflected and undeflected beamlets may arrive at beam stop array, which may have a plurality of apertures. The beamlet blanker array and beam stop array may operate together to block or let pass the beamlets. If the beamlet blanker array deflects a beamlet, it will not pass through the corresponding aperture in the beam stop array, but instead it will be blocked. But, when the beamlet blanker array does not deflect a beamlet, it will pass through the corresponding aperture in the beam stop array, and through the beam deflector array and the projection lens arrays.

The beam deflector array may provide for deflection of each beamlet in the x- and/or y-direction (for example in a plane parallel with the target surface), substantially perpendicular to the z-direction of the undeflected beamlets, to scan the beamlets across the surface of the target.

The beamlets may pass through projection lens arrays and may be projected onto the wafer 530. The projection lens array preferably provides a demagnification in the order of 25 to 500 times (depending of the specific electron-optical lay out). The beamlets may impinge on the surface of the wafer. For lithography applications, wafer is usually provided with a charged-particle sensitive layer or resist layer.

The lithography system may operate at least partly in a vacuum environment. A vacuum may be desired to remove particles which may be ionized by the patterning beams and become attracted to the beam source and may dissociate and be deposited onto the machine components and may disperse the patterning beams or beamlets. In order to maintain the vacuum environment, the lithography system may comprise a vacuum chamber 520, which may include a metal shielding layer or layers 521. All of the major elements of the lithography system are preferably housed in the vacuum chamber, such as beam source, the optical column and the moveable chuck.

Each modular subsystem may require a large number of electrical signals and/or optical signals, and electrical power for its operation. The modular subsystems inside the vacuum chamber 520 may receive these signals from a processor unit 524 which is preferably located outside of the chamber.

In the embodiment of FIG. 5, as an example, grooves 402 with tracks 110 (the tracks are not shown in FIG. 5) have been provided in the frame, or more particular in the main frame 515. In this case, the liftable module may be the long stroke module 119. In order to lift this module, bodies 116 may be inserted between the frame and the liftable module, or more particular, the bodies 116 may be inserted in the grooves 402, as is explained above. In this case, the assembly may be provided in its normal configuration.

Furthermore, in FIG. 5, as another example, grooves 402 with tracks 110 (the tracks are not shown in FIG. 5) have been provided in the illumination optics module 501, which may be the liftable module in this case. When bodies 116 are inserted in the grooves 402, the module 501 may be lifted. In this case, the assembly may be provided in its upside-down configuration.

In the above also a method is described for lifting a module of a lithography system from its support in a vertical direction, comprising the steps of providing a lithography system according to any of the embodiments described in this document and inserting the body between the liftable module and the support. The method may further comprise the step of horizontally moving the liftable with respect to its support, preferably onto a movable cart.

It may be understood that embodiments of the invention may also be used for positioning a liftable module on its support. Instead of inserting the body between the module and the support, the body may removed, causing the module to be lowered or positioned on the support.

Furthermore, according to another aspect of the invention, a module of a lithography system may be exchanged, by first removing a first liftable module from its support (steps a-d below) and then positioning a second liftable module on the support (steps e-g below).

A method for exchanging a module of lithography system can thus be described by the steps of:
a) providing a lithography system according to an embodiment as described in this document;
b) providing a movable cart as described in this document;
c) inserting the body between the liftable module and the support, thereby lifting said module from the support;
d) horizontally moving the liftable module with respect to its support onto the movable cart.

Since the body may comprise guiding wheels 123 and the moveable cart may comprise guiding wheels 202, the method may comprise adjusting the position and/or the orientation of guiding wheels of the movable cart in order to align the guiding wheels of said cart with guiding wheels of the body. In that case, the liftable module may be horizontally moved with respect to its support onto the guiding wheels of the movable cart.

After removal of the module (steps a-d), an other liftable module may be positioned on the support, using the following steps e-g:
e) providing another movable cart for carrying the other liftable module, wherein the other liftable module is arranged on the other movable cart;
f) horizontally moving the other liftable module with respect to the other movable cart onto the body; and,
g) removing the body between the other liftable module and the support, thereby lowering said module onto the support.

Since the body may comprise guiding wheels 123 and the moveable cart may also comprise guiding wheels 202, the method may comprise adjusting the position and/or the orientation of guiding wheels of the other movable cart in order to align the guiding wheels of said cart with guiding wheels of the body. In that case, the liftable module may be horizontally moved with respect to the card onto the guiding wheels of body.

Instead of another movable cart, the same cart that is provided in step b) may be used. Thus the movable cart and the other movable cart may be the same cart.

It may be understood that any described embodiment of a lithography system using an electron beam to pattern a target may also be applied to a lithography system using a light beam to pattern a target, mutatis mutandis.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Assembly for lifting a module (122; 501, 504, 507, 509, 518, 519, 531) of a lithography system (500) from its support (401) in a vertical direction relative to said support, said assembly, comprising:
   a track (110) provided on the module or on said support and arranged for contacting the first and the second wheel of said body (116);
   a body (116) provided with a first and a second wheel (117, 118), both wheels extending vertically from a central horizontal plane (130) of the body,
   wherein:
   the first wheel (117) vertically extends further from said central horizontal plane of the body (116) than the second wheel (118);
   said body is moveable relative to said module and said support and is configured to be inserted between the module and the support for causing the module to be lifted from the support;
   said track is arranged for guiding the body between the module (122) and the support when said boy is inserted between the module and the support, wherein the track comprises a ramp (111; 112) so that when the body is advanced along the ramp of the track, the module is lifted from the support.

2. Assembly according to claim 1, wherein the first wheel (117) vertically extends a distance h further from said central horizontal plane (130) of the body (116) than the second wheel (118) and an axis (120) of the first wheel is positioned in the horizontal direction at a distance D from an axis (121) of the second wheel.

3. Assembly according to claim 2, wherein the track comprises a first and a second ramp, the first ramp being direct congruent with the second ramp, wherein a start of the first ramp is positioned at said distance D from a start of the second ramp in the horizontal direction and at said distance h from the start of the second ramp in the vertical direction.

4. Assembly according to claim 3, wherein:
   the track (110) further comprises a first and a second horizontal plateau (124, 125);
   a start (26) of the first plateau (124) positioned at the distance D from a start (127) of the second plateau (125) in the horizontal direction and at the distance h from the start of the second plateau in the vertical direction; and,
   the first plateau (124) is arranged between the first ramp (111) and the second ramp (112).

5. Assembly according to claim 4, wherein the track (110) further comprises a third horizontal plateau (128), connected to the start (114) of the first ramp (111).

6. Assembly according to claim 3, wherein the first ramp is connected to the second ramp and the first and the second ramp form together a single ramp.

7. Assembly according to claim 3, wherein the slope of the first ramp (111) and the second ramp (112) is in the range of 1:50-1:200, or about 1:100.

8. Assembly according to claim 1, wherein the body comprises a horizontal surface (119), wherein the horizontal surface is arranged opposite to the first and second wheel with respect to the central horizontal plane (130).

9. Assembly according to claim 8, wherein the body (116) is further provided with guiding wheels (123).

10. Assembly according to claim 9, wherein said guiding wheels (123) define said horizontal surface (119).

11. Assembly according to claim 1, wherein the first wheel (117) and the second wheel (118) extend in a vertically downwards direction from the central horizontal plane (130) of the body (116).

12. Assembly according to claim 1, further comprising a movable cart (201) for carrying the module (122), wherein the cart comprises:
   guiding wheels (202 for guiding and supporting the module (112); and,
   adjusters for adjusting the position and/or the orientation of the guiding wheels in order to align the guiding wheels of the cart with the guiding wheels of the body.

13. Assembly according to claim 1, further comprising connectors for releasably connecting the body with the support.

14. Lithography system for processing a target with a patterning beam, the lithography system comprising:
   a set of modules for providing the patterning beam and for moving the target with respect to the patterning beam, wherein said set comprises a liftable module;
   a frame for supporting the set of modules; and,
   the assembly according to claim 1 for lifting said liftable module in the vertical direction,
   wherein the liftable module is supported by a support, the support being the frame or another module of said set;
   wherein the track of the assembly is arranged on the support or on the liftable module and the body of the assembly is arranged to be inserted between the liftable module and the support.

15. Lithography system according to claim 14, wherein a groove (402) is provided in the support (401) or the liftable module and is arranged for guiding the body during insertion of the body between the liftable module and the support, and wherein the track is provided in the groove.

16. Lithography system according to claim 15, wherein the body has an elongated shape and the groove has an elongated shape.

17. Lithography system according to claim 14, further comprising a restrictor arranged for restricting a movement of the module in an insertion direction of the body.

18. Method for lifting a module of a lithography system from its support in a vertical direction, comprising the steps of:
   providing a lithography system according to claim 14; and,
   inserting the body between the liftable module and the support.

19. Method according to claim 18, further comprising the step of:
   horizontally moving the liftable module with respect to its support.

20. Method for exchanging a module of lithography system, comprising the steps of:
   a) providing a lithography system according to claim 14,
   b) providing a movable cart for carrying the liftable module;
   c) inserting the body between the liftable module and the support, thereby lifting said module from the support;
   d) horizontally moving the liftable module with respect to its support onto the movable cart.

21. Method according to claim 20, wherein step d) further comprises:
   d1) adjusting the position and/or the orientation of guiding wheels of the movable cart in order to align the guiding wheels of said cart with guiding wheels of the body; and,
   d2) horizontally moving the liftable module with respect to its support onto the guiding wheels of the movable cart.

22. Method according to claim 20, further comprising the steps of:
   e) providing another movable cart for carrying another liftable module, wherein another liftable module is arranged on the other movable cart;
   f) horizontally moving the other liftable module with respect to the cart onto the body; and,
   g) removing the body between the other liftable module and the support, thereby lowering said module onto the support.

23. Method according to claim 22, wherein step f) further comprises:
   f1) adjusting the position and/or the orientation of guiding wheels of the other movable cart in order to align the guiding wheels of said cart with guiding wheels of the body; and,
   f2) horizontally moving the liftable module with respect to the cart onto the guiding wheels of the body.

24. Method according to claim 22, wherein the movable cart and the other movable cart are the same cart.

25. Assembly for lifting a module (122) of a lithography system (500) from its support in a vertical direction wherein a track is provided on the module or on said support and is arranged for contacting the first and the second gliding device of said body,
   said assembly comprising:
   a body provided with a first and a second gliding device, both gliding devices extending vertically from a central horizontal plane of the body,
   wherein the first gliding device vertically extends further from said central horizontal plane of the body than the second gliding device; and
   said body is moveable relative to said module and said support and adapted to be inserted between the module and the support for causing the module to be lifted from the support; and
   said track is arranged for guiding the body between the module and the support when said body is inserted between the module and the support, wherein the track comprises a ramp so that when the body is advanced along the ramp of the track, the module is lifted from the support.

26. Assembly according to claim 25, wherein the first and second gliding device each comprises a curved surface or a spike for contacting the track at a respective contact point of said curved surface.

27. Assembly according to claim 26, wherein the first gliding device vertically extends a distance h further from said central horizontal plane of the body than the second gliding device and the contact point of the first gliding device is positioned in the horizontal direction at a distance D from the contact point of the second gliding device.

28. Assembly according to claim 27, wherein the track comprises a first and a second ramp, the first ramp being direct congruent with the second ramp, wherein a start of the first ramp is positioned at said distance D from a start of the second ramp in the horizontal direction and at said distance h from the start of the second ramp in the vertical direction.

29. Assembly according to claim 1 or claim 25, wherein the body is provided with guiding rollers or other guiding devices for contacting the module and decreasing the friction between said body and the module.

* * * * *

UNITED STATES PATENT AND TRADEMARK OFFICE
CERTIFICATE OF CORRECTION

| | |
|---|---|
| PATENT NO. | : 9,199,829 B2 |
| APPLICATION NO. | : 13/610392 |
| DATED | : December 1, 2015 |
| INVENTOR(S) | : Jerry Johannes Martinus Peijster |

It is certified that error appears in the above-identified patent and that said Letters Patent is hereby corrected as shown below:

In the claims,

Column 11, Claim 1, line 22, delete "assembly, comprising:" and insert -- assembly comprising --

Column 11, Claim 1, line 38, delete "when said boy is inserted" and insert -- when said body is inserted --

Column 12, Claim 12, line 19, delete "wheels (202 for guiding" and insert -- wheels (202) for guiding --

Column 12, Claim 14, lines 37-38, delete "arranged on the sup-port" and insert -- arranged on the support --

Signed and Sealed this
Fourteenth Day of June, 2016

Michelle K. Lee
*Director of the United States Patent and Trademark Office*